(12) United States Patent
Cohen et al.

(10) Patent No.: US 7,033,927 B2
(45) Date of Patent: Apr. 25, 2006

(54) APPARATUS AND METHOD FOR THERMAL ISOLATION, CIRCUIT COOLING AND ELECTROMAGNETIC SHIELDING OF A WAFER

(75) Inventors: Guy M. Cohen, Mohegan Lake, NY (US); Daniel C. Edelstein, White Plains, NY (US); Keith A. Jenkins, Sleepy Hollow, NY (US); Chirag S. Patel, Peekskill, NY (US); Lie Shan, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/872,451

(22) Filed: Jun. 22, 2004

(65) Prior Publication Data
US 2005/0282381 A1 Dec. 22, 2005

(51) Int. Cl.
*H01L 21/4763* (2006.01)
(52) U.S. Cl. ............... 438/637; 438/411; 438/422; 257/709
(58) Field of Classification Search ........ 438/637, 438/411, 421, 422; 257/709, 618
See application file for complete search history.

(56) References Cited
U.S. PATENT DOCUMENTS
6,100,199 A 8/2000 Joshi et al.

2002/0033189 A1 * 3/2002 Macris ............ 136/203

OTHER PUBLICATIONS

Wu, J.H., et al., "A Faraday Cage Isolation Structure for Substrate Crosstalk Suppression," IEEE Microwave and Wireless Components Letters, vol. 11, No. 10, Oct. 2001.
Soh, H.T., et al., "Ultra-Low Resistance, Through-Wafer VIA (TWV) Technology and its Applications in Three Dimensional Structures on Silicon," Japanese Journal of Applied Physics, vol. 38, 1999.
Wu, j., et al., "A High Aspect Ratio Silicon Substrate-Via Technnology and Applications: Through-Wafer Interconnects for Power and Ground and Faraday Cages for SOC Isolation," IEDM, 2000.

* cited by examiner

*Primary Examiner*—Caridad Everhart
(74) *Attorney, Agent, or Firm*—Duane Morris LLP

(57) ABSTRACT

The disclosure relates to method and apparatus for isolating sensitive regions of a semiconductor device by providing a thermal path or an electromagnetic shield. The thermal path may include vias having different length, depth and configuration such that the thermal path between the two regions is lengthened. In addition, the vias may be fully or partially filled with an insulating material having defined conductive properties to further retard heat electromagnetic or heat transmission between the regions. In another embodiment, electrical isolation between two regions is achieved by etching a closed loop or an open loop trench at the border of the regions and filling the trench with a conductive material to provide proper termination of electromagnetic fields within the substrate.

6 Claims, 10 Drawing Sheets

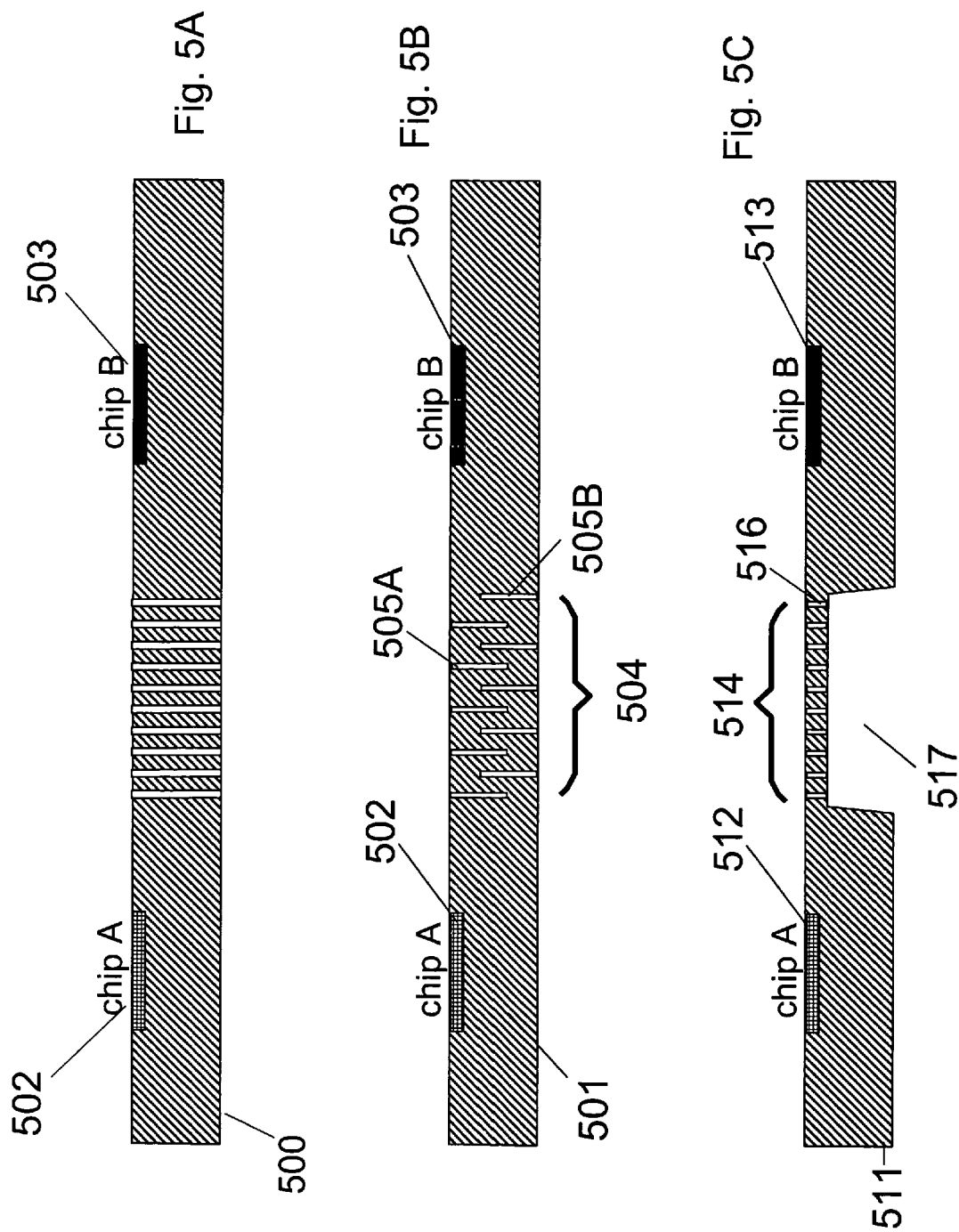

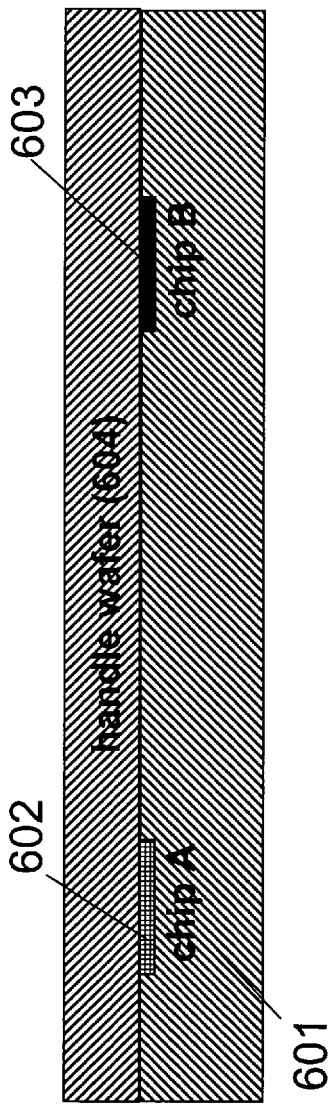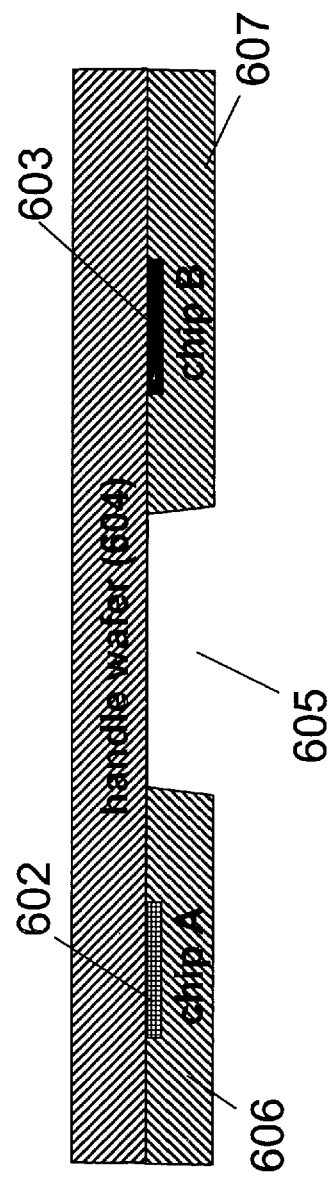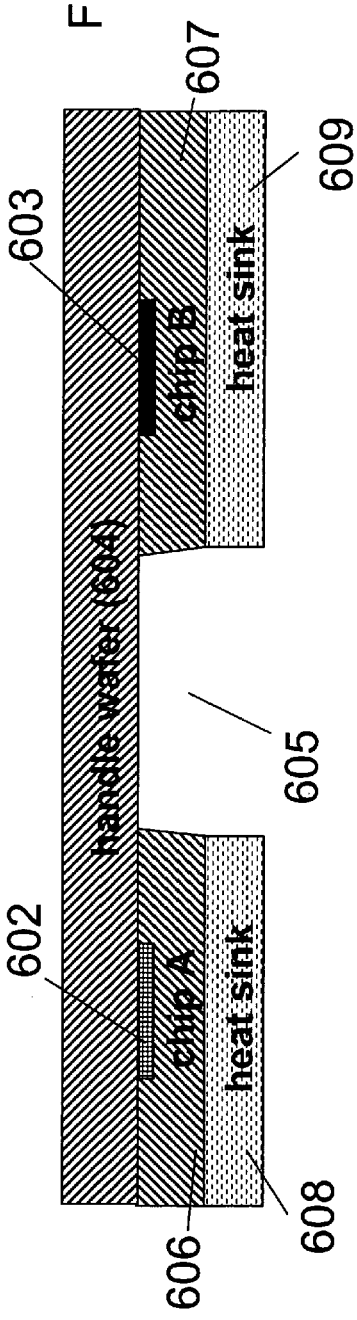

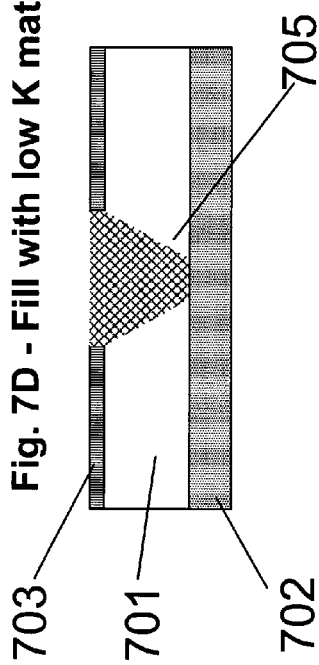
Fig. 7D - Fill with low K material
Fig. 7E - Planarization
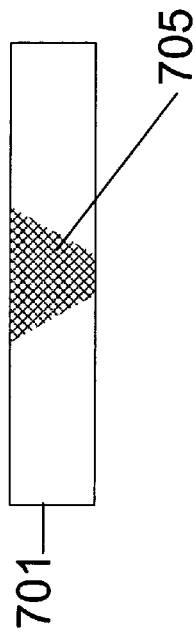
Fig. 7F - Handle removal
Fig. 7A - Wafer
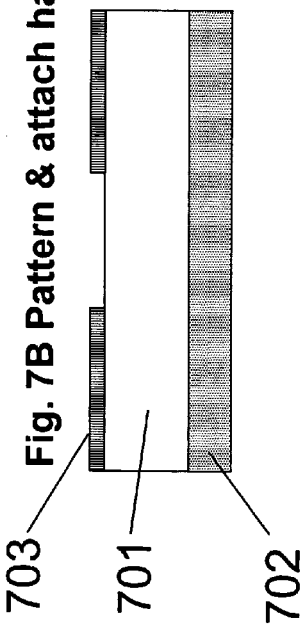
Fig. 7B Pattern & attach handle
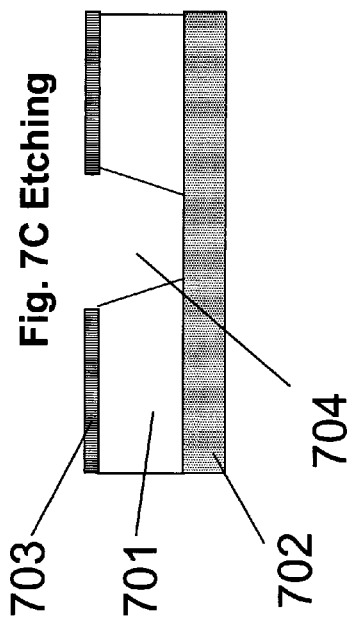
Fig. 7C Etching

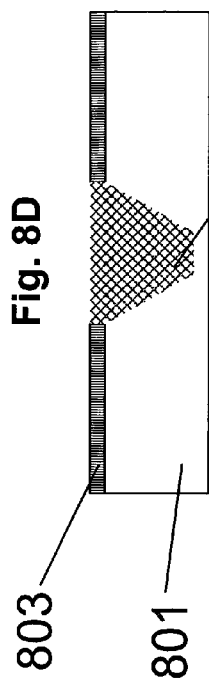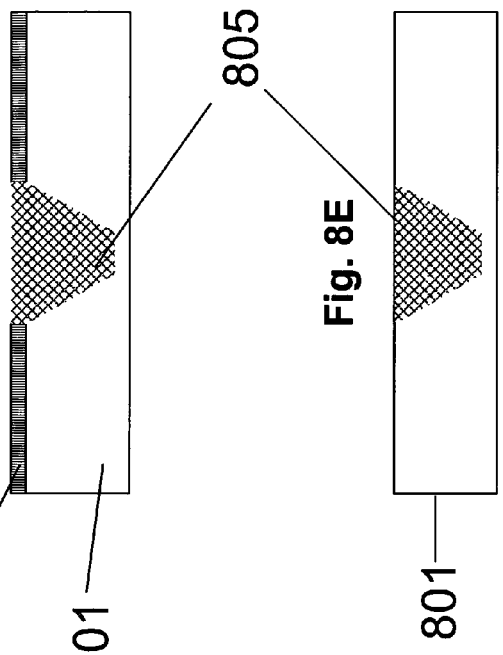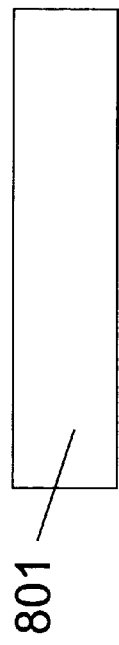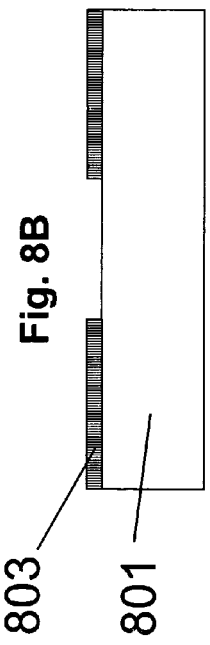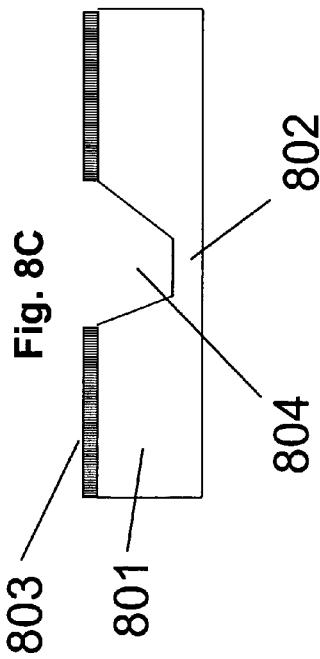

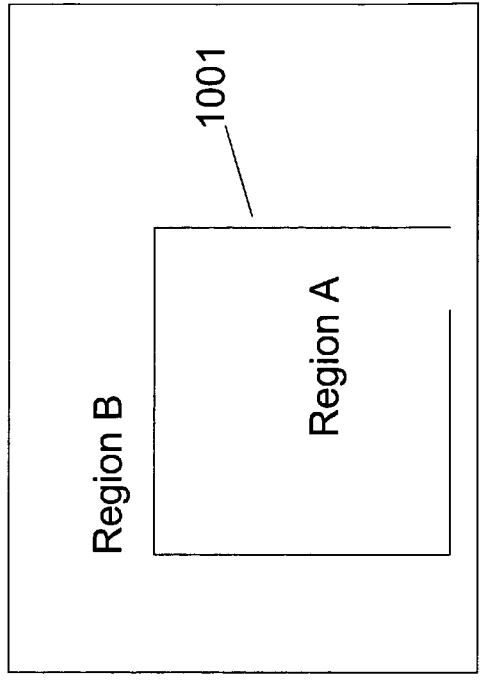
Fig. 10A
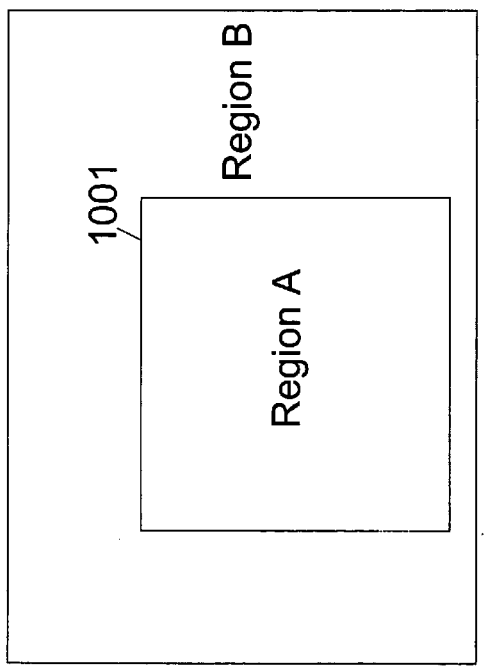
Fig. 10b
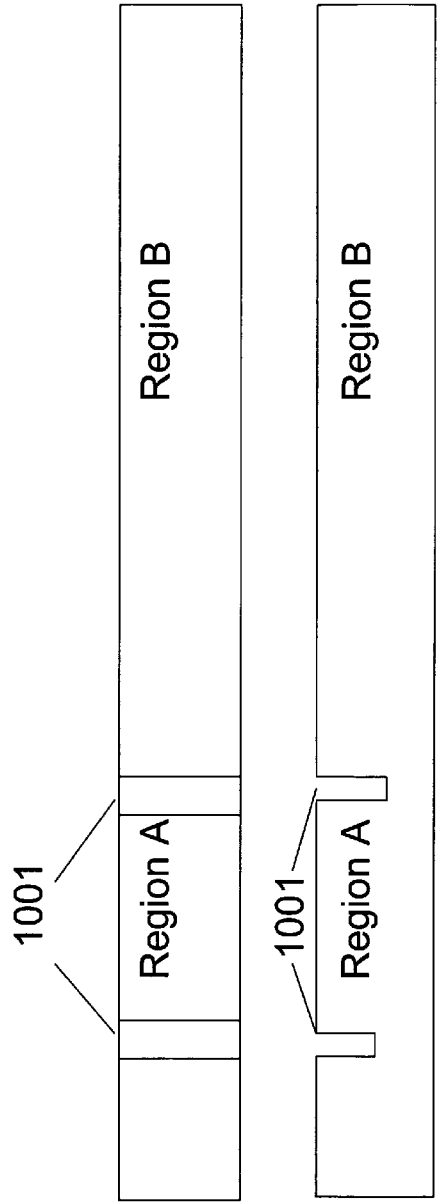
Fig. 10C
Fig. 10D

APPARATUS AND METHOD FOR THERMAL ISOLATION, CIRCUIT COOLING AND ELECTROMAGNETIC SHIELDING OF A WAFER

BACKGROUND

The operation of semiconductor devices such as laser diodes and photodiodes is sensitive to the device temperature. For example, the laser emission wavelength will typically shift as the device temperature rises. This shift is undesirable and, for optimal results, should be avoided. In many applications the laser diode is mounted on a separate substrate than that of the electronics that drives the laser. Physical separation is required so that the power dissipated by the laser driver circuit does not heat the laser diode. Physical separation, however, complicates system integration and packaging. For example, since separate substrates are used for mounting the laser and the laser driver chip, long wire traces are required to electrically connect the two together. The design of such wire (typically referred to as transmission lines at the frequency of operation) is not trivial. Moreover, to reduce losses the transmission lines should be made on insulating substrates which further limit the choice of substrate on which the laser diode may be mounted. Integrating the driver circuit and the laser diode on the same substrate is desirable since it would eliminate excess transmission lines and an insulating substrate. Because silicon is a good heat conductor, the close integration of the laser driver and the laser diode on the same silicon substrate is not possible for the reasons explained above.

It is therefore desirable to provide a substrate structure which enables thermal isolation between at least two regions of the substrate. The isolation structure should occupy a small area on the substrate. In addition to thermal isolation, efficient cooling of hot regions is also needed to reduce thermal cross-talk between the two regions.

Integration of digital components with analog or RF components on a single chip for System on a Chip ("SOC") applications or on a single substrate for System on a Package applications is highly desirable to improve system performance and to achieve higher level of miniaturization. Digital components tend to be noisy and disturb the performance of sensitive low-noise RF or analog components. For an effective system, it is desirable to electrically shield the RF/analog components from the digital logic components.

SUMMARY OF THE DISCLOSURE

In one embodiment, the disclosure is directed to a system-on-chip where a first region is thermally isolated from a second region by a thermal barrier in the form of a maze of through wafer vias. The barrier region defines a thermal path between the first region and the second region. To extend the thermal path, the region may have a plurality of vias formed thereon in the shape of a maze. The maze of through-vias lengthen the thermal path between the two regions so thermal resistance between the regions is increased. In an exemplary embodiment, the two regions may comprise two circuits built on the same substrate. In another exemplary embodiment, two region are formed on a carrier onto which the chips are flipped bonded.

In another embodiment, the disclosure relates to a semiconductor device having a substrate with a first and a second circuit regions, where the first circuit region emits electromagnetic energy or noise. To isolate the second region from the noise, an electromagnetic shield may be formed to shield the first region by communicating with a voltage source or with the ground. The electromagnetic shield may be interposed between the first an the second regions and at least partially encompass one of the first or the second regions. In one embodiment, the shield defines a continues structure. Finally, the electromagnetic shield may be configured to define a thermal path between the first and the second regions.

In still another embodiment, the disclosure relates to a method for thermo-electrically shielding a sensitive region of a semiconductor wafer by defining a first and a second region on the semiconductor, the first region generating thermo-electrical noise which conducts through a thermal path to the second region. A barrier region may be formed the substrate to separate the two regions. The barrier region may have a plurality of discrete vias extending through a cross section of the substrate to thereby lengthen the thermal path between the regions. The vias may be configured to have a pattern in order to extend the thermal path between the regions. The barrier between the regions may be formed by etching a trench by removing the wafer material in the trench region such that the trench bottom reaches a handle substrate. Optionally, the trench may be filled with a non-conductive material and the handle substrate may be then removed.

In another embodiment, the disclosure is directed to a system-on-chip device where the regions are thermally isolated using a thermal barrier. The region(s) that dissipate heat may be optionally cooled by a heat sink. The heat sink may include extensions (e.g., fingers) that extend trough the wafer and reach below the hot region's surface. The extensions may be made by drilling trenches that stop short of the wafer surface and fill the vias with a thermal conductor such as copper. The cooling structure is particularly suitable if the circuit regions that require cooling are built on SOI and have a buried oxide ("BOX") layer serving as a stop-etch region.

In another embodiment, the disclosure is directed to an SOC where thermal barriers define an interdigitated trenches etched from both sides of the wafer in an overlapping manner. Here, the thermal path is lengthened since heat has to travel in different directions (up/down, zig zag, etc.) to cross the trenched area.

In another embodiment, an SOI wafer is attached to a thermally non-conductive substrate. The SOI wafer may be thinned by removing or grinding a portion thereof. The remaining silicon can be selectively etched using BOX as an etch-stop layer. A thermal barrier between two regions of the remaining SOI film may then be formed by etching a trench that separates the two regions. The trench may optionally reach the thermally non-conductive substrate. Finally, the trench may be filled with a non-conductive material and planarized to further deter noise (thermal or electromagnetic) transmission between the two regions.

BRIEF DESCRIPTION OF THE DRAWINGS

The various embodiments of the disclosure are described with reference to the following non-exclusive illustrations in which similar elements are numbered similarly, and where:

FIGS. 5A–5C illustrate various x-sectional views of the different embodiments of the disclosure;

FIGS. 6A–6C show a process for thermally isolating two chips on a substrate;

FIGS. 7A–7F illustrate a process for forming a thermal barrier according to another embodiment of the disclosure;

FIGS. 8A–8F illustrate the process steps for forming a thermal barrier according to another embodiment of the disclosure;

FIGS. 10A–10D illustrate closed or open loop trenches forming an electromagnetic shield between two regions of a substrate.

DETAILED DESCRIPTION

Figure 1:
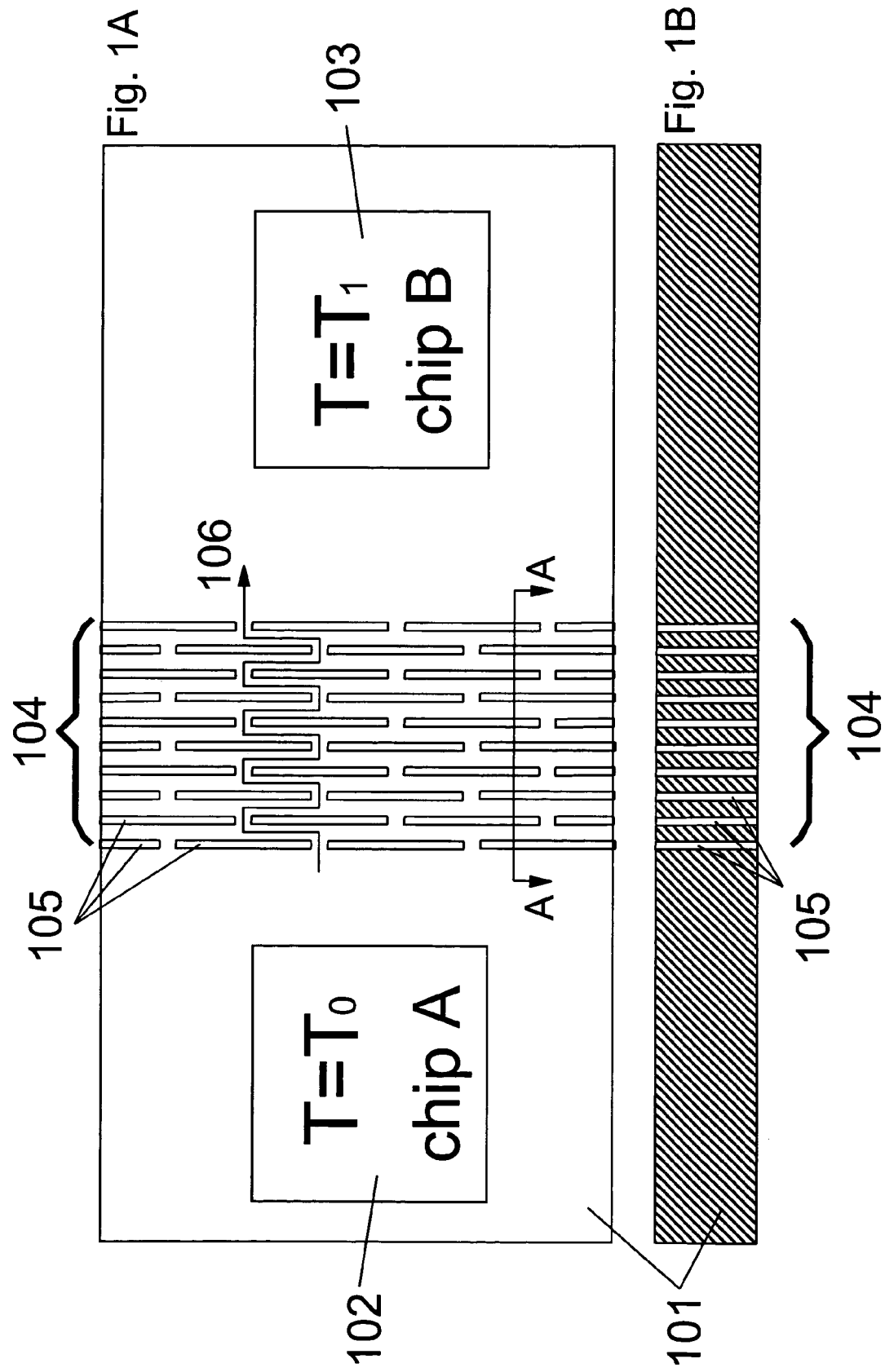
FIGS. 1A–1B respectively illustrate a top view and a cross-sectional view of a thermal barrier formed by a maze of through-vias.

FIGS. 1A and 1B show a silicon substrate 101 including chip A occupying region 102, chip B occupying region 103 and a thermal barrier 104 separating the two regions. The term "chip" as used herein, generally refers to a semiconductor wafer mounted on the substrate 101 or alternatively to a circuit fabricated in the silicon substrate 101. The thermal barrier includes through vias 105 devised to form a maze-type structure. The maze of through-vias 105 lengthen the thermal path between chip A 102 and chip B 103 as illustrated by arrow 106. In the exemplary embodiment of FIG. 1, thermal impedance is increased since vias 105 are poor thermal conductors and since conduction primarily occurs in the solid portion of maze 104 as indicated by the arrow 106. FIG. 1B shows a cross sectional view of substrate 101 having through vias 105 formed thereon. Thus, in accordance with one embodiment of the disclosure, thermal isolation may be enhanced by lengthening the conductive thermal path.

Figure 2:
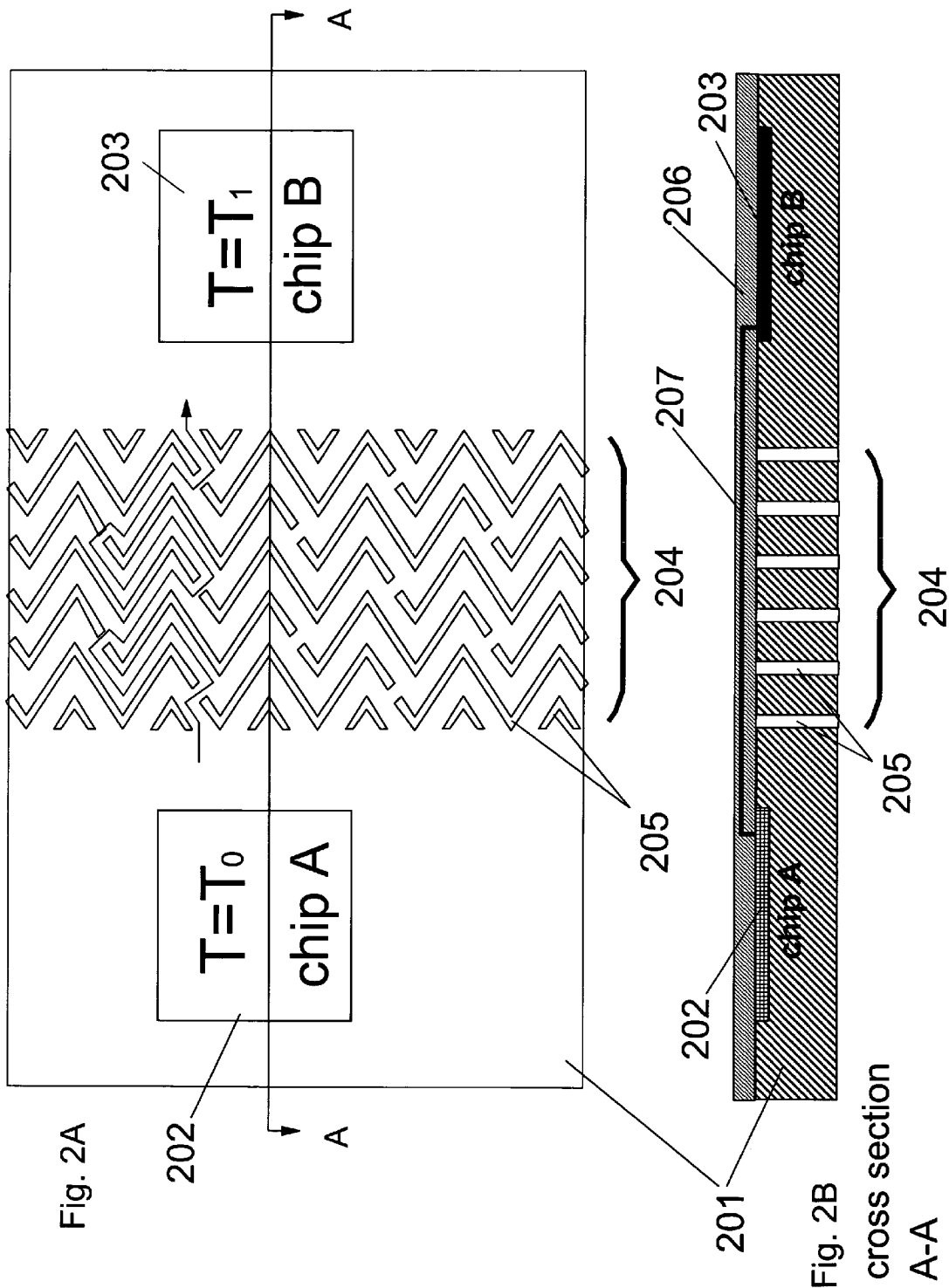
FIGS. 2A–2B illustrate a top view of maze layout of through-vias.

The shape of through-vias 105 is not limited to simple rectangles. FIG. 2 shows a different maze layout. As shown in FIG. 2, maze 204 comprises a zigzag of through-vias 205. The shape, width and length of vias 205 is optimized to increase the thermal impedance.

To electrically connect chip A 202 to chip B 203 a layer of a thermally insulating material 206 (such as $SiO_2$) may be formed on the top surface of substrate 201 and wires 207 may be formed in layer 206. Layer 206 and wiring 207 may be fabricated prior to etching through wafer vias 205. Through-vias 205 may be etched from the bottom surface of the wafer (the surface not containing the circuit). Layer 206 may be fabricated after trenches 205 are made by laminating a solid sheet of a dielectric material such as polyimide.

Figure 3:
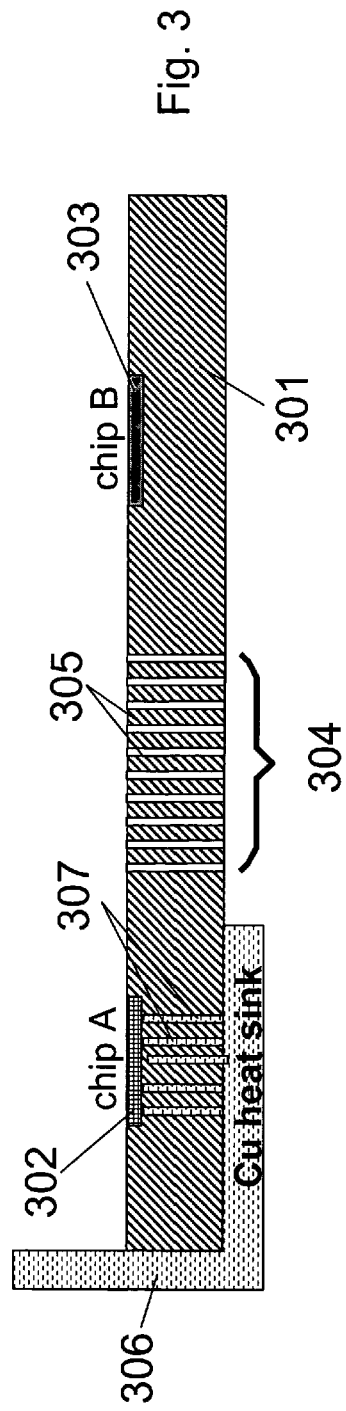
FIG. 3 illustrates a cross-sectional view of a chip in which two areas are isolated by through vias.

FIG. 3 shows a cross-sectional view of substrate 301 which includes chip A 302 and chip B 303. The chips are thermally isolated by a thermal barrier 304 formed by a maze of thermal-vias 305. Chip A 302 is cooled by heat sink 306. The heat sink's operation is enhanced by a set of thermally conducting fingers 307. Fingers 307 extend from heat sink 306 at the bottom of substrate 301 to the top'surface but (optionally) do not break through the substrate's top surface. Fingers 307 may be made by drilling a set of trenches and then filling the trenches with a thermal conductor such as copper.

Figure 4:
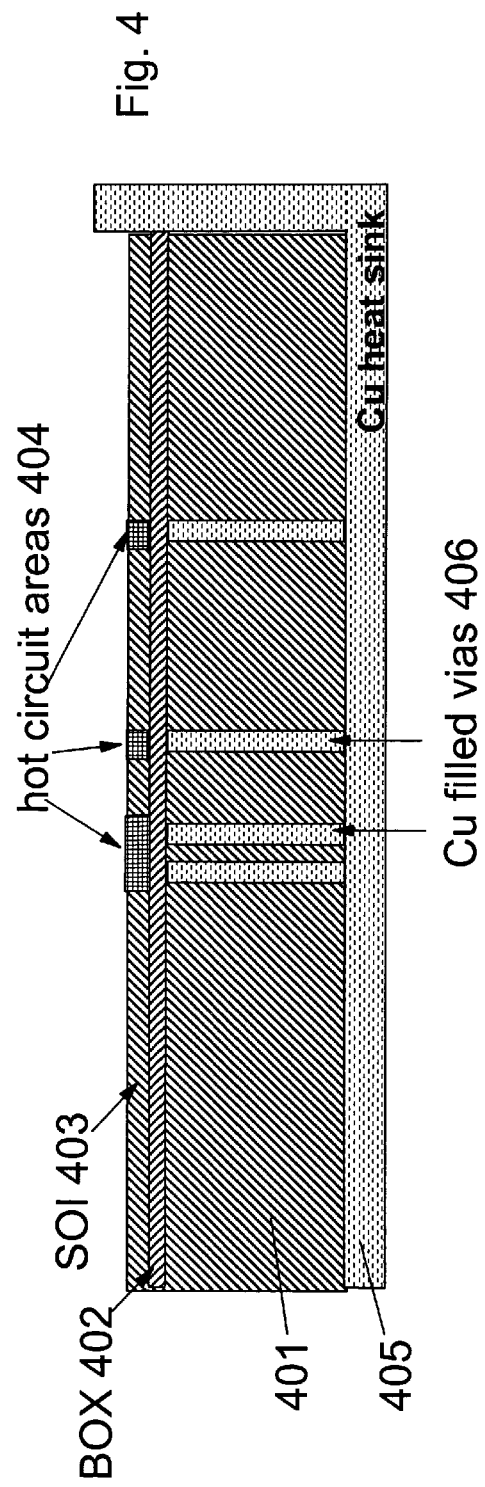
FIG. 4 shows another method for cooling the chip surface according to another embodiment of the disclosure.

FIG. 4 shows another method for cooling the chip surface according to another embodiment of the disclosure. More specifically, FIG. 4 illustrates cooling of hot areas in an SOI chip by a copper heat sink with copper filled trenches. Referring to FIG. 4, substrate 401 includes BOX layer 402, SOI film 403 and circuit with hot spots 404. The hot spots 404 are typically circuits in a chip that dissipate more power and thus require additional cooling. Cooling fingers 406 are formed under the hot spots to facilitate heat conduction from hot spot 404 to heat sink 405. Fingers 406 may be made by etching trenches from the backside of substrate 401 and using BOX layer 402 as a stop etch layer. The trenches may optionally be filled with a good heat conductor material such as copper.

FIGS. 5A–5C illustrate x-sectional views of the different embodiments of the disclosure. FIG. 5A shows an embodiment similar to that disclosed with reference to FIGS. 1A–1B; namely, substrate 500 having chip A and chip B separated by through vias acting as a thermal barrier. FIG. 5B show substrate 501 including chip A 502, chip B 503 and thermal barrier 504. The thermal barrier includes top trenches 505A and bottom trenches 505B formed on the top and bottom surfaces of the substrate, respectively. It can be readily seen that vias 505A and 505 B overlap over a portion of substrate 501 thereby lengthening the thermal conduction path. Some or all of the trenches may be filled with a thermally non-conductive material. As discussed in relation with FIG. 2, the thermal path is lengthen since heat is conducted in an up/down pattern in order to transmit across the trenched area 504. The traversing may be combined with the zigzag flow imposed by a maze architecture as discussed earlier to obtain an even greater thermal impedance.

FIG. 5C shows substrate 511 including chip A 512 and chip B 513 separated by thermal barrier 514. Thermal barrier 514 includes a maze of through-vias 516 and cavity 517. Thermal impedance is increased since through vias are formed in a thinned portion of the substrate. The structure may be formed by first etching (optionally, from the back side of the substrate) a cavity 517 and then etching through-vias 516 from the top surface.

FIGS. 6A–6C show another embodiment of the disclosure where a thermal barrier between chip A 602 and chip B 603 is formed by fully etching a portion of the substrate that thermally connects the two chips. Referring to FIG. 6A, a thermally insulating handle substrate 604 is attached to substrate 601 having thereon chip A 602 and chip B 603. Substrate 601 may be thinned to a specified thickness. For example, a 200 mm Si substrate can be thinned down to about 20 microns by grinding and polishing. Where substrate 601 is an SOI substrate in which chips A 602 and chip B 603 are formed in a SOI film over a buried oxide layer, the thinning process may be much more aggressive. In one such embodiment, substrate 601 is first ground down to a thickness of about 20 microns. The substrate's silicon is then selectively etched, with the etch terminating on the buried oxide layer (not shown.) An example of suitable silicon etchant that is selective to silicon dioxide is TMAH (tetramethylammonium hydroxide.) This process allows thinning substrate 601 down to the thickness of the SOI film (i.e., about 0.1 micron in conventional CMOS technology.)

Referring to FIG. 6B, thermal barrier 605 is formed by etching the portion of the thinned substrate that thermally connect chip A 602 and chip B 603. The etching forms two regions 606 and 607 within the original substrate 601; these regions are thermally isolated. Separate heat sinks 608 and 609 are attached to the isolated substrate regions as shown in FIG. 6C.

The handle wafer 604 may include electrical traces so that chip A 602 can electrically communicate with chip B 603. These wires are typically thin enough and sparse enough to not be a significant thermal conductor between the two chips. Alternatively, the wires are embedded in an insulator such as oxide formed on the original substrate 601 prior to bonding.

FIGS. 7A–7F illustrate a process for forming a thermal barrier according to another embodiment of the disclosure. More specifically, FIGS. 7A–7F illustrate a process for fabricating a thermal barrier having a trench filled with a thermally non-conductive material. In FIG. 7A, wafer 701 such as a silicon wafer is provided. In step 2 (FIG. 7B) the wafer's underside is attached to handle wafer 702 and mask 703 is deposited and patterned to define the location of the thermal barrier. In step 3 (FIG. 7C) trench 704 is etched in the substrate. As shown, the trench bottom reaches the handle wafer 702. In step 4 (FIG. 7D) trench 704 is filled with a thermally non-conductive material 705 ("the fill material"). Exemplary non-conductive fill material include polymer, oxides, nitrides, porous films and air. In step 5 (FIG. 7E) the structure is planarized and mask 703 is removed. In the optional step 6, shown in FIG. 7F, handle wafer 702 is removed and the structure is sustained due to the adhering nature of the fill material. Filling the trench enables placing electrical wires across the two thermally isolated regions of the wafer.

FIGS. 8A–8F illustrate the process steps for forming a thermal barrier according to another embodiment of the disclosure. Specifically, FIGS. 8A–8F illustrate a variation of the process flow shown in FIGS. 7A–7F where the handle wafer is eliminated. In step 1 (FIG. 8A) wafer 801 is provided. In step 2 (FIG. 8B) mask 803 is deposited and patterned to define the location of the thermal barrier. In step 3 (FIG. 8C) a trench 804 is etched in the substrate 801. The trench does not break through the wafer, but leaves membrane of silicon 802 at the bottom of the trench. In step 4 (FIG. 8D) trench 804 is filled with thermally non-conductive material 805. In step 5 (FIG. 8E) the structure is planarized and mask 803 is removed. In step 6 (FIG. 8F) the underside of wafer 801 is polished (or etched) to remove membrane 802. Etching of trench 804 may be implemented, for example, by using anisotropic silicon etchant such as potassium hydroxide (KOH). When such etchant is used mask 803 opening will also determine the depth of the trench since the etch will conventionally stop when the crystallographic <111> planes are exposed.

Figure 9A:
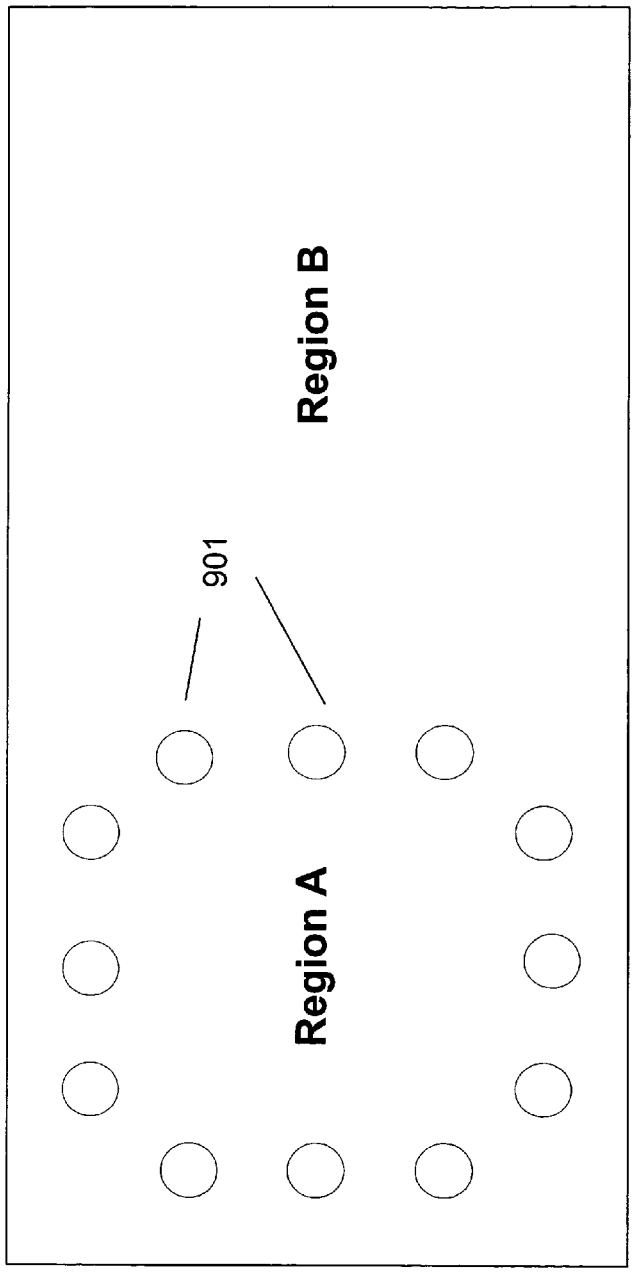
FIGS. 9A–9C show top and cross-sectional views of an electromagnetic shield formed between two regions using discrete embedded vias.
Figure 9B:
Figure 9C:
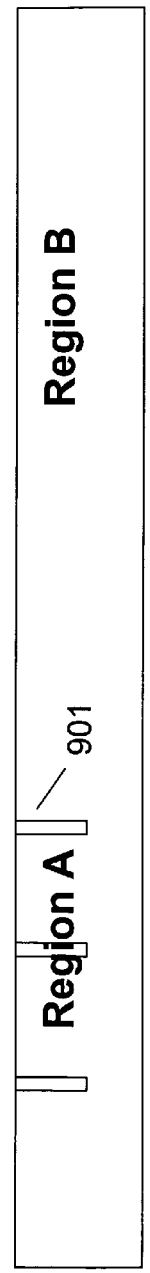

FIGS. 9A–9C show top and cross-sectional views of an electromagnetic shield formed between two regions by a construction of through or embedded vias. A top view is shown in FIG. 9A where, vias 901 of desired dimensions are etched into a substrate (not shown) forming a boundary around the region of interest (e.g., a thermally sensitive chip) to provide electromagnetic shielding. For the purpose of the illustration, vias 901 are shown to be formed around region A to isolate region A from region B in FIG. 9A. However, the number of regions and the formation of via shields may vary in shape and size without departing from the principles of the disclosure. Vias 901 may be formed, for example, by Reactive Ion Etching ("RIE") or other chemically known methods. FIG. 9B shows a cross-sectional view of the via shield structure where vias 901 are shown to continue through the substrate. FIG. 9C shows a cross-sectional view of the via shield structure where the vias are shown to be embedded within the substrate. The vias may be fully or partially filled with a conductive material including copper, nickel, conductive pastes, etc. Where the via is partially filled, the remaining volume of the via may be filled with a conductive material, a non-conductive material or left unfilled.

FIGS. 10A–10D illustrate closed or open loop trenches forming an electromagnetic shield between two regions of a substrate. A top view of a closed loop trench and an open loop trench is shown in FIGS. 10A and 10B, respectively, where a trench of desired dimensions is etched into a substrate forming a boundary around the region of interest to provide electromagnetic shielding. For the purpose of illustration, trench 1001 is shown to have been formed around region A, isolating this region from region B in FIGS. 10A and 10B. In FIG. 10B Region B is isolated from Region A vis-à-vis the open loop trench 1001. However, the number of regions and the formation of trench shields may vary in shape, size and configuration. The trench may be formed by Reactive Ion Etching or other conventional methods. FIG. 10C shows a cross-sectional view of trench shield 1001 where the trench is shown to extend through the substrate. FIG. 10D shows a cross-sectional view of the trench shield structure where trench 1001 is shown to be embedded within the substrate. The trench may be fully or partially filled with a conductive material such as copper, nickel, conductive pastes, etc.

Figure 11A:
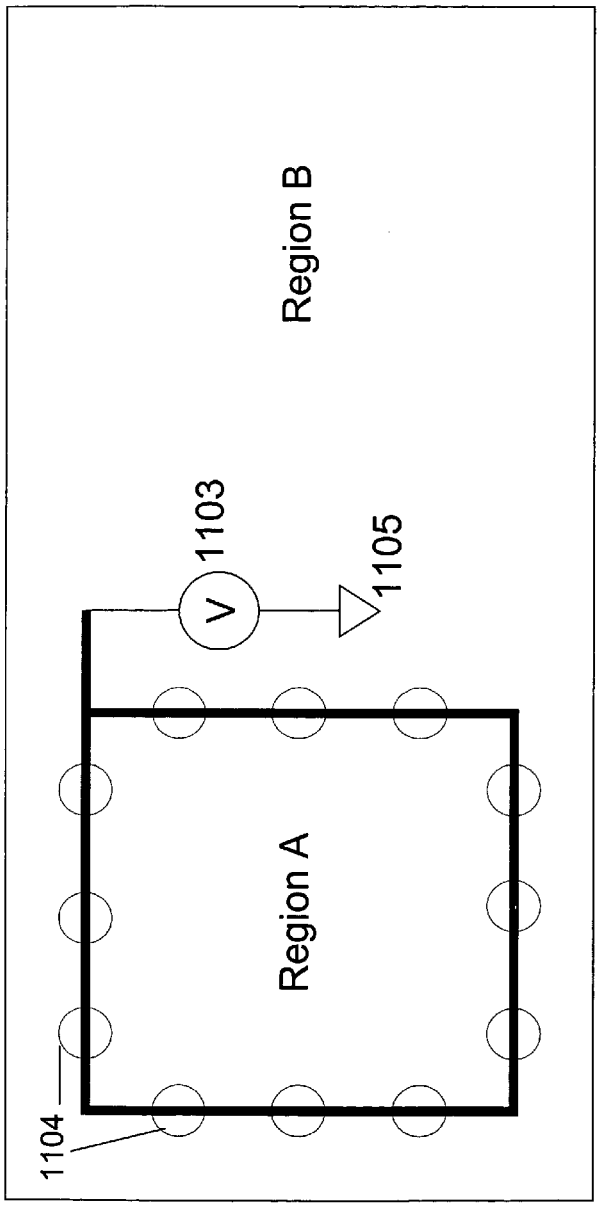
FIGS. 11A–11C show various embodiments of the disclosure for grounding electromagnetic shields.
Figure 11C:
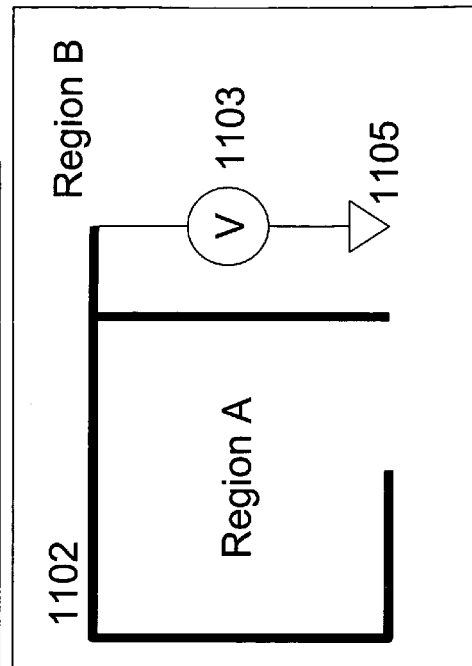
Figure 11B:
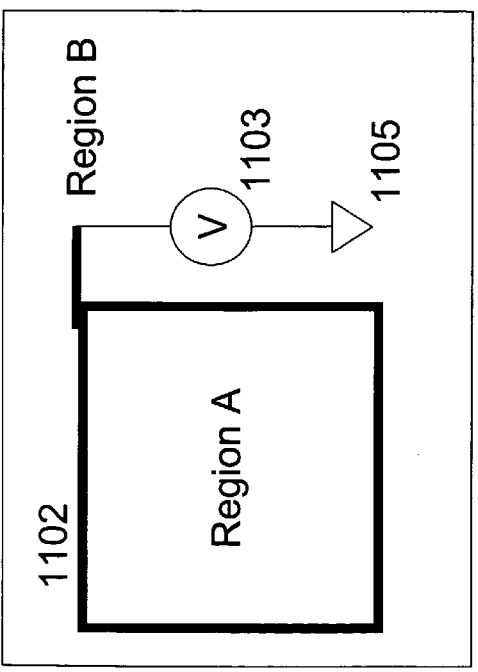

FIGS. 11A–11C show the presence of electrical contacts to the via shield or the trench shield structures by using subsequent levels of wiring built onto the chip or the substrate. The electrical contacts may be biased at a desired potential to provide an effective electromagnetic shield between the regions of interest. In addition, the electrical contacts may be grounded to avoid electromagnetic interference and improve shielding. FIG. 11A shows Region A in electromagnetic communication with voltage source which may be ground. Each of trenches 1104 are shown to communicate with source 1103 or ground 1105. The electromagnetic shield of FIG. 11A may be similar to that shown in FIG. 9. FIG. 11B shows an electromagnetic shield provided by trench 1102 in communication with voltage source 1103 or ground 1105. Similarly, FIG. 11B illustrates the structure of FIG. 10(B) having open-loop trench 1102 coupled to voltage source 1103 or optionally to ground 1105.

Although the principles of the disclosure have been discussed in relation with the exemplary embodiments presented herein, it is noted that the invention is not limited thereto and includes permutations and modifications of the principles disclosed herein. For example, the electromagnetic shield illustrated in FIGS. 9 and 10 may be combined with a thermal shield as shown in FIGS. 1–5 to further thermal and electromagnetic isolation. According to this embodiment, the resulting structure may have one or more electromagnetic shields interposed, at least partially, between the regions A and B, as well as a barrier region having defining a thermal path between these regions. The electromagnetic shield may optionally be coupled to a voltage source or ground.

What is claimed is:

1. A wafer comprising:
    a substrate having a first region and a second region, the first region dissipating heat; and
    a barrier region defining a thermal path between the first region and the second region, the barrier region having a plurality of vias arranged thereon to lengthen the thermal path between the first and the second regions;
    wherein the barrier region further comprises a cavity for separating the first and the second regions.

2. The wafer of claim 1, further comprising a heat sink in thermal contact with one of the first or the second regions.

3. The wafer of claim 1, wherein the cavity is in thermal contact with one of the plurality of vias.

4. The wafer of claim 1, wherein the first and the second regions are electrically connected by a conductor.

5. The wafer of claim 4, wherein the conductor at least partially overlaps the barrier region.

6. A method for thermo-electrically shielding a sensitive region of a semiconductor wafer; comprising:
   defining a first and a second region on the semiconductor, the first region generating thermo-electrical energy, the thermo-electrical energy conducing through a path to the second region;
   forming a barrier region on the substrate, the barrier region having a plurality of discrete vias extending through a cross section of the substrate; and
   lengthening the thermal path by positioning the plurality of vias in a pattern;
   wherein the pattern defines interdigitated trenches etched from both side of the wafer.

* * * * *